US007511329B2

(12) United States Patent
Chen et al.

(10) Patent No.: US 7,511,329 B2
(45) Date of Patent: Mar. 31, 2009

(54) NAND-TYPE NON-VOLATILE MEMORY

(75) Inventors: Chien-Hung Chen, Hsin-Chu (TW); Nai-Chen Peng, Hsin-Chu (TW); Kuang-Pi Lee, Tai-Chung Hsien (TW); Tzu-Ping Chen, Hsin-Chu (TW)

(73) Assignee: United Microelectronics Corp., Hsin-Chu (TW)

(*) Notice: Subject to any disclaimer, the term of this patent is extended or adjusted under 35 U.S.C. 154(b) by 79 days.

(21) Appl. No.: 10/906,535

(22) Filed: Feb. 24, 2005

(65) Prior Publication Data

US 2006/0186455 A1 Aug. 24, 2006

(51) Int. Cl.
*H01L 23/62* (2006.01)

(52) U.S. Cl. .......... 257/314

(58) Field of Classification Search .......... 438/257; 257/314, 324; 365/185.33, 149, 62
See application file for complete search history.

(56) References Cited

U.S. PATENT DOCUMENTS 5,508,957 A 4/1996 Momodomi
5,646,888 A * 7/1997 Mori .......... 365/185.33
5,732,010 A * 3/1998 Takashima et al. .......... 365/63
5,936,887 A 8/1999 Choi
6,281,075 B1 * 8/2001 Yuan et al. .......... 438/257
6,529,410 B1 3/2003 Han
6,620,683 B1 * 9/2003 Lin et al. .......... 438/257
6,674,120 B2 * 1/2004 Fujiwara .......... 257/324
6,775,177 B2 * 8/2004 Okamoto et al. .......... 365/149
6,900,098 B1 * 5/2005 Ogura et al. .......... 438/257
2004/0057286 A1 3/2004 Chen
2005/0087892 A1 4/2005 Hsu et al.
2005/0167730 A1 * 8/2005 Lee et al. .......... 257/314

FOREIGN PATENT DOCUMENTS

TW 1220560 8/2004

* cited by examiner

*Primary Examiner*—Evan Pert
*Assistant Examiner*—Monica D Harrison
(74) *Attorney, Agent, or Firm*—Winston Hsu

(57) ABSTRACT

A non-volatile memory includes a substrate, a plurality of data storage elements positioned on the substrate, a plurality of control gates positioned above the data storage elements, an insulating layer positioned on surfaces and sidewalls of the control gates, and a bit-line positioned on the insulating layer to cross the control gates.

20 Claims, 12 Drawing Sheets

| Operation mode | $V_{BL,selected}$ / $V_{BL,unselected}$ | $V_{WL}$ / $V_{pass}$ | $V_{BL,i,selected}$ / $V_{BL,i,unselected}$ | $V_{SL}$ | $V_{WELL}$ |
|---|---|---|---|---|---|
| Program | +6V / 0V | −6V / +6V | +4.5V / Float | 0V | 0V |
| Erase | 0V | +12V / 0V | 0V | 0V | 0V |
| Read | +3.3V | 0V/+5V | +1.5V / 0V | 0V | 0V |

Fig. 12

NAND-TYPE NON-VOLATILE MEMORY

BACKGROUND OF INVENTION

1. Field of the Invention

The present invention relates to a non-volatile memory, and more particularly, to a NAND-type non-volatile memory.

2. Description of the Prior Art

A flash memory belongs to a non-volatile memory and has an important characteristic of storing data in the memory even though the power is turned off. In addition, having a high operation speed for repeated read, program and erase is also important for the flash memory to be widely used and rapidly developed. The flash memory can be divided according to structure into NOR flash memory and NAND flash memory. The drains of memory cells of a NOR flash memory are connected in parallel for a faster reading speed, which is suitable for code flash memory mainly used for executing program code. The drains and sources of two neighboring memory cells of a NAND flash memory are serially connected for integrating more memory cells per unit area, which is suitable for a data flash memory mainly used for data storage. Both NOR flash memory and NAND flash memory have a MOS-like memory cell structure, so as to provide advantages of small size, high operation speed and high density.

Referring to FIG. 1, FIG. 1 is a cross-sectional diagram of a flash memory according to the prior art. As shown in FIG. 1, a flash memory 10 has a substrate 12, a P well 14 formed in the substrate 12, a plurality of N-type doping regions 16 formed in the P well 14, and a plurality of stacked structures composed of an oxide layer 18, a floating gate 20, an oxide layer 22, and a control gate 24 formed on the substrate 12.

Each of the N-type doping regions 16 is used to define a buried drain/source (BD/BS), and a channel region L is defined between two neighboring N-type doping regions 16. In the manufacturing processes, the oxide layer 18, the floating gate 20, the oxide layer 22, and the control gate 24 are respectively formed and patterned on the surface of the P well 14, and thereafter, the N-type doping regions are formed using a doping process to dope N-type ions into a predetermined region of the P well 14, and using a thermal process to activate and diffuse the N-type ions so as to complete the profiles of the N-type doping regions 16 and the channel regions L. During the thermal process, however, the N-type ions doped into the P well 14 can be laterally diffused to shorten a length of the channel region L. To ensure the channel length satisfying specific device characteristics, a conventional method is used to increase the line widths of the stacked structures, including the control gate 24, so as to increase the distance between two neighboring N-type doping regions 16 to reserve enough space for the thermal diffusion. While the distance between two neighboring N-type doping regions 16 is increased, a feature size of the memory cell is also increased. Therefore, how to consider a tradeoff between the channel length and the thermal budget so as to obtain satisfying device characteristics without sacrificing the cell size becomes an important issue.

SUMMARY OF INVENTION

It is therefore an object of the present invention to provide a non-volatile memory to prevent a cell size limitation resulted from a thermal budget.

According to one embodiment of the present invention, the non-volatile memory includes a substrate, a plurality of data storage elements positioned on the substrate, a plurality of control gates positioned above the data storage elements, an insulating layer positioned on surfaces and sidewalls of the control gates, and a bit-line positioned on the insulating layer to cross the control gates.

It is an advantage of the present invention that the bit-line is positioned above the control gates to replace the buried drain in the conventional flash memory. Therefore, the processes such as doping and thermal treatment for forming the buried drain are not necessary, and the problems such as channel length shortening by a thermal diffusion and cell size limitation by a thermal budget can be prevented. In addition, the bit line of the present invention is used to define either a local drain/source of a memory cell or an isolation structure between two memory cells according to a voltage supplied to the bit line. In this case, an extra isolation structure such as a field oxide layer or a shallow isolation trench is not necessary to be formed to isolate two neighboring bit lines from each other. Furthermore, the memory cell of the present invention can be referred to a twin-bit nitride-local-trap memory cell, such as a SONOS cell, so as to provide a 2F2 cell size and a cell array with higher density.

These and other objects of the claimed invention will be apparent to those of ordinary skill in the art with reference to the following detailed description of the preferred embodiments illustrated in the various drawings.

BRIEF DESCRIPTION OF DRAWINGS

FIG. 12 is a parameter list for operating a non-volatile memory shown according to the present invention.

DETAILED DESCRIPTION

Figure 1:
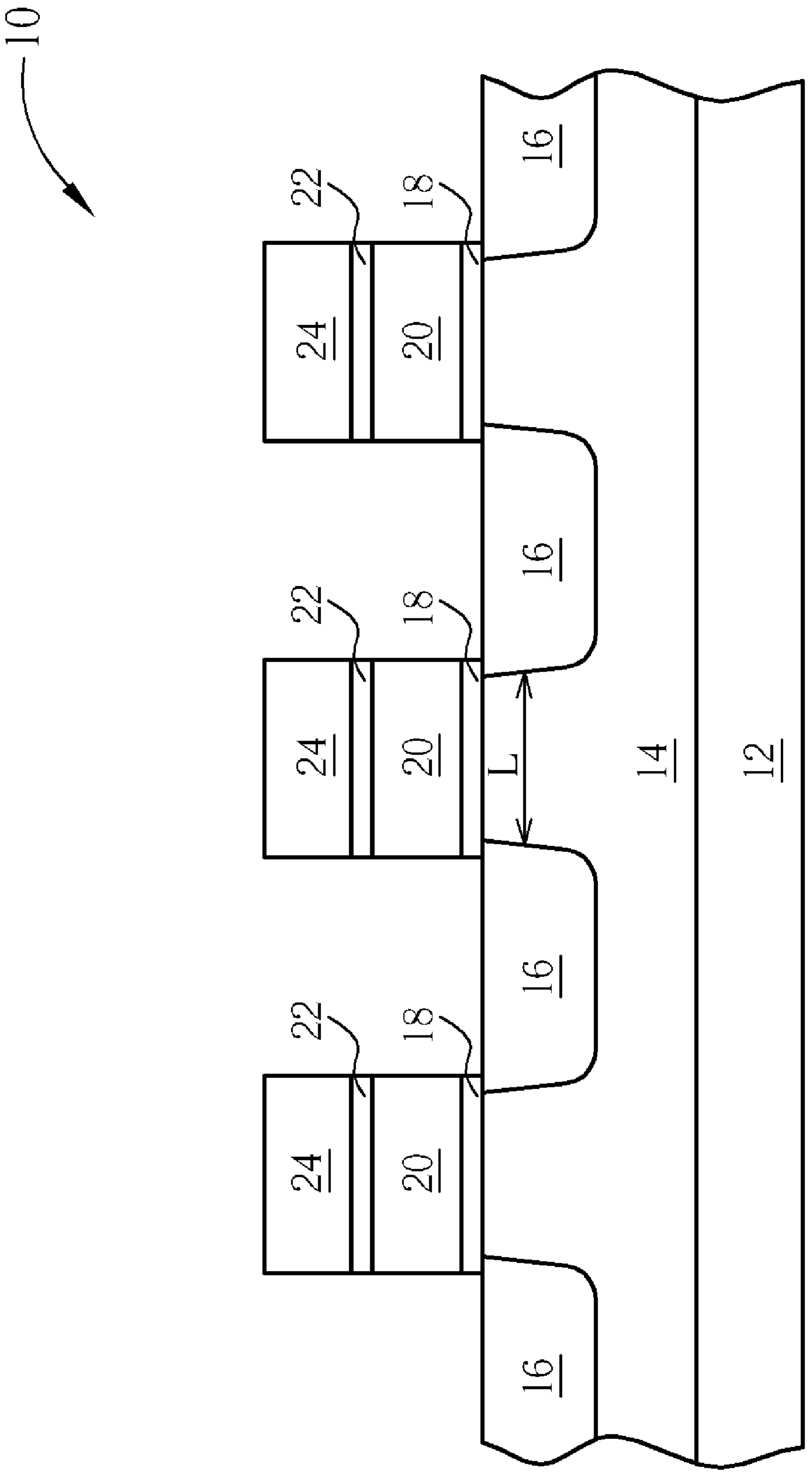
FIG. 1 is a cross-sectional diagram of a flash memory according to the prior art.
Figure 2:
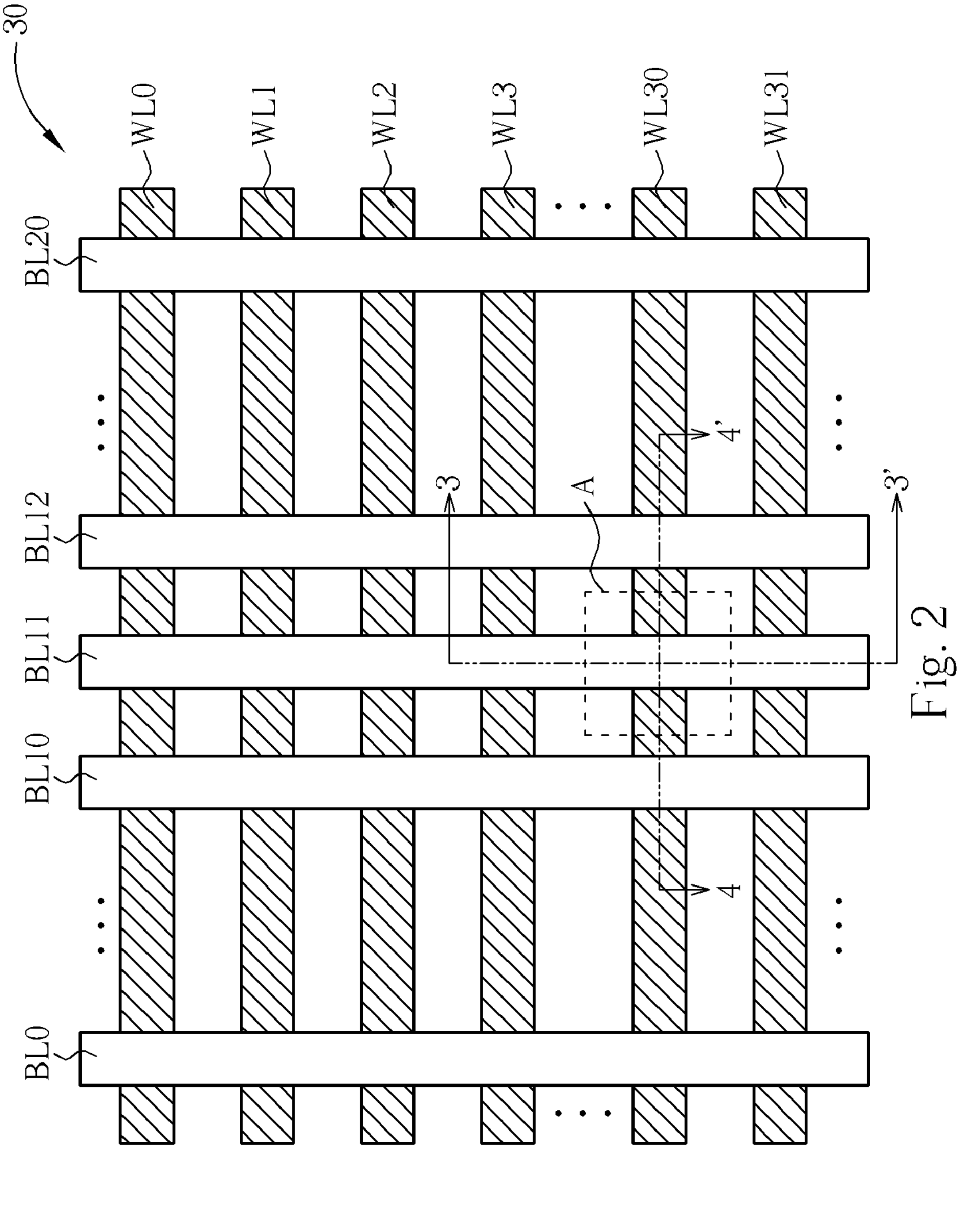
FIG. 2 is a schematic diagram of a non-volatile memory array according to the present invention.

Referring to FIG. 2, FIG. 2 is a schematic diagram of a non-volatile memory array according to the present invention. As shown in FIG. 2, a non-volatile memory 30 includes a plurality of word lines, such as WL0-WL31, and a plurality of bit lines, such as BL0-BL20, positioned above the word lines and crossing the word lines. Each of the bit lines is perpendicular to each of the word lines, and a memory cell, such as A, is defined at each of the intersection regions of the bit lines and the word lines. In a preferred embodiment of the present invention, a memory cell string along a bit line has about 16-32 memory cells.

Figure 3:
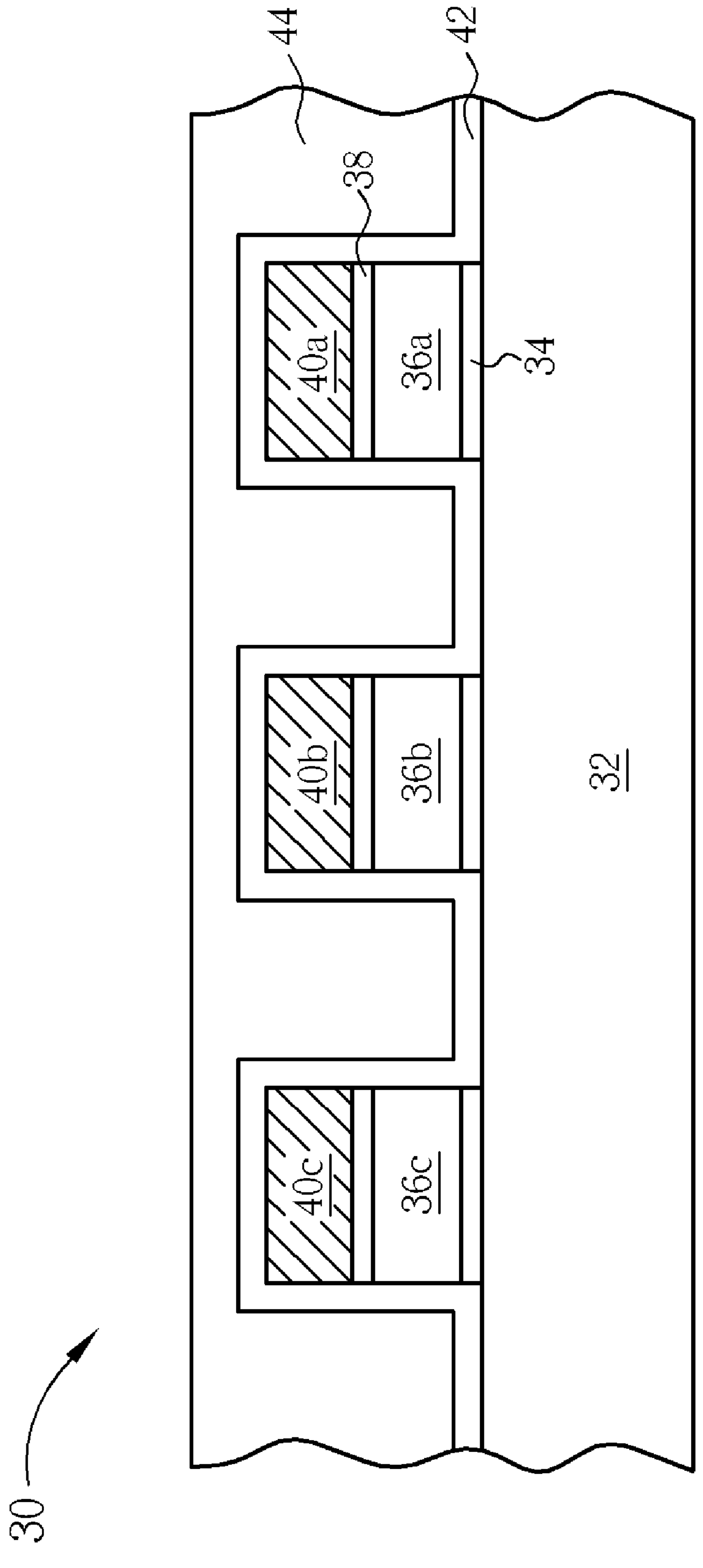
FIG. 3 is a cross-sectional view of the non-volatile memory shown in FIG. 2 along a line 33'.

Referring to FIG. 3, FIG. 3 is a cross-sectional view of the non-volatile memory shown in FIG. 2 along a line 33'. As shown in FIG. 3, the non-volatile memory 30 includes a substrate 32, an oxide layer 34 positioned on the substrate 32, a plurality of data storage elements 36*a*, 36*b*, and 36*c* positioned on the oxide layer 34, an oxide layer 38 positioned on the data storage elements 36*a*, 36*b*, and 36*c*, and a plurality of control gates 40*a*, 40*b*, and 40*c* positioned on the oxide layer 38. The non-volatile memory 30 further has an insulating layer 42 positioned on surfaces and sidewalls of the control gates 40*a*, 40*b*, and 40*c*, and a bit line 44 positioned on the insulating layer 42 to cross the control gates 40*a*, 40*b*, and 40*c*.

In a preferred embodiment of the resent invention, the substrate 32 can be a P-type silicon substrate, an N well, or a P well. The data storage elements 36*a*, 36*b*, and 36*c* can be a floating gate of doped polysilicon to store one-bit data in each memory cell. The data storage elements 36*a*, 36*b*, and 36*c* can also be a nitride layer to store one-bit or twin-bit data in each memory cell. In addition, the data storage elements 36*a*, 36*b*, and 36*c* can also be made of materials capable of storing electrons and insulated from the bit line 44 using the insulating layer 42.

The control gates 40*a*, 40*b*, and 40*c* are defined by a plurality of parallel word lines, and the bit line 44 is one of the bit lines crossing these parallel word lines. The bit line 44 and the control gates 40*a*, 40*b*, and 40*c* can be made of doped polysilicon or other semiconductor/conductor materials, and can be used to control the memory cell operation. The insulating layer 42 can be a silicon oxide layer or a silicon nitride layer, and can be used to insulate the bit line 44 from other device elements. For example, the insulating layer 42 can be used to insulate the bit line 44 from the control gates 40*a*, 40*b*, and 40*c*. In addition, the insulating layer 42 can be used to insulate the bit line 44 from the data storage elements 36*a*, 36*b*, and 36*c*, or from the substrate 32. According to different manufacture processes, the insulating layer 42 can be a single deposition layer, a composite deposition layer, or a combination of a cap layer and a spacer.

Figure 4:
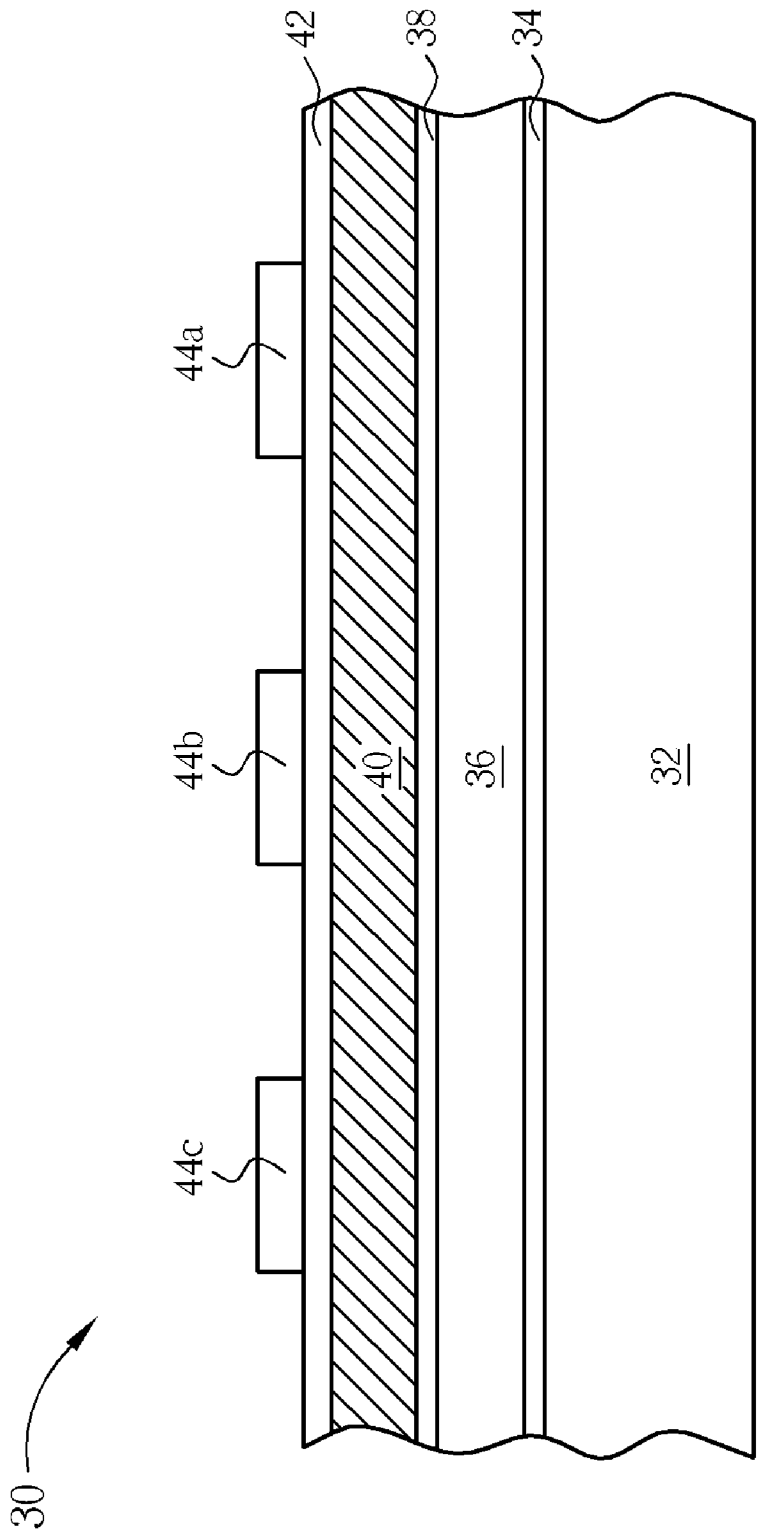
FIG. 4 is a cross-sectional view of the non-volatile memory shown in FIG. 2 along a line 44'.

Referring to FIG. 4, FIG. 4 is a cross-sectional view of the non-volatile memory shown in FIG. 2 along a line 44'. As shown in FIG. 4, the non-volatile memory 30 includes the oxide layer 34, the data storage element 36, the oxide layer 38, the control gate 40, and the insulating layer 42 positioned on the substrate 32, respectively. In addition, a plurality of the bit lines 44a, 44b, and 44c are positioned on the insulating layer 42. The bit lines 44*a*, 44*b*, and 44*c* are parallel bit lines, and a plurality of continuous memory cells are defined by the overlapping bit lines 44*a*, 44*b*, 44*c*, the control gate 40, and the data storage element 36.

An introduction to the operation of the non-volatile memory can be referred to the following three embodiments of the present invention. In a first embodiment shown in FIG. 5 and FIG. 6, a Fowler-Nordheim tunneling mechanism or a band-to-band tunneling induced hot-hole injection (BTBTHH) mechanism is used to remove electrons from a selected memory cell so to achieve a programming operation of the non-volatile memory 30. In addition, a Fowler-Nordheim tunneling mechanism is used to introduce electrons into a selected memory cell so as to achieve an erasing operation of the non-volatile memory 30.

Figure 5:
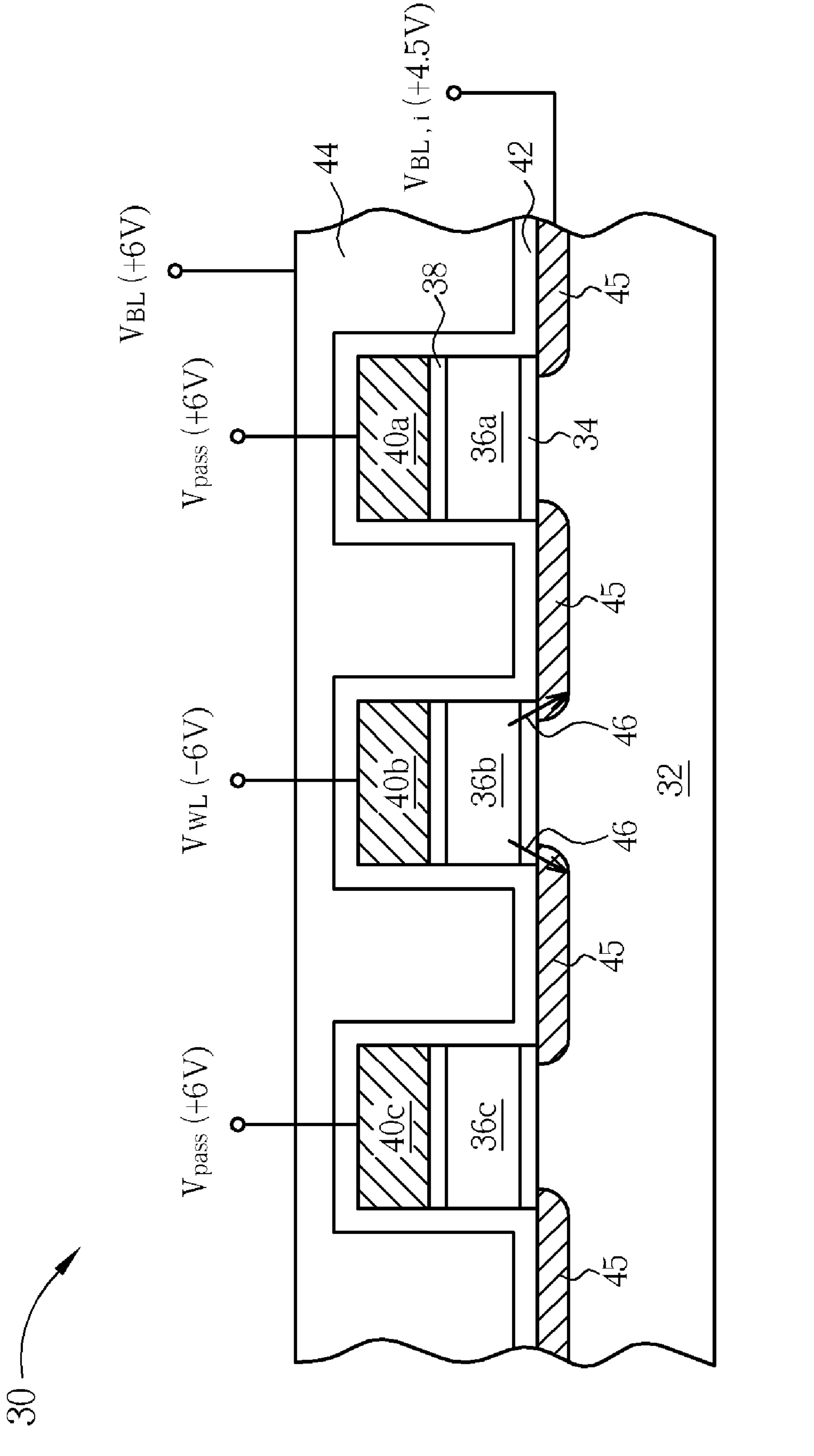
FIG. 5 and FIG. 6 illustrate a first embodiment of the present invention to program and erase a non-volatile memory.

For example, to remove electrons from the selected data storage element 36*b* following an arrow direction 46 shown in FIG. 5, a negative voltage $V_{WL}$ is supplied to the selected control gate 40*b* above the data storage element 36*b*, a positive voltage $V_{BL}$ is supplied to the selected bit line 44 above the data storage element 36*b*, and a positive voltage $V_{pass}$ is supplied to the unselected control gates (such as the control gates 40*a*, 40*c*) crossing the bit line 44. The negative voltage $V_{WL}$ is suggested to between −5V and −15V, and a preferred value of $V_{WL}$ can be −6V. The positive voltages $V_{BL}$ and $V_{pass}$ are suggested to between +5V and +10V, and a preferred value of $V_{BL}$ and $V_{pass}$ can be +6V. When the positive voltage is supplied to the bit line 44, an inversion layer 45 is induced on the surface of the substrate 32 underneath the bit line 44, and the inversion layer 45 is used to transmit the bit line voltage to the source/drain of the selected memory cell. Preferably, a positive voltage $V_{BL,i}$, ranging between +4.5V and +5V, is supplied to the inversion layer 45, and thus a voltage difference of about 10.5V is provided between the gate and the drain of the selected memory cell to support the Fowler-Nordheim tunneling operation. In this embodiment, the bit line 44 functions as a pass gate of the memory cell string along the bit line 44, and defines the voltage at the drain side of the selected memory cell. Because of the voltage difference between the selected control gate 40*b* and the drain side, electrons stored in the selected data storage element 36*b* can be removed following the direction 46. To obtain better efficiency for operating a twin-bit memory cell, a buried doping region can be optionally formed in the substrate 32 to define a buried drain/source of each memory cell. A positive voltage can be supplied to the buried doping region to increase the voltage difference between the selected control gate 40*b* and the drain side. The voltage supplied to the buried doping region is suggested to between +1V and +5V, and a preferred value can be +4.5V.

Figure 6:
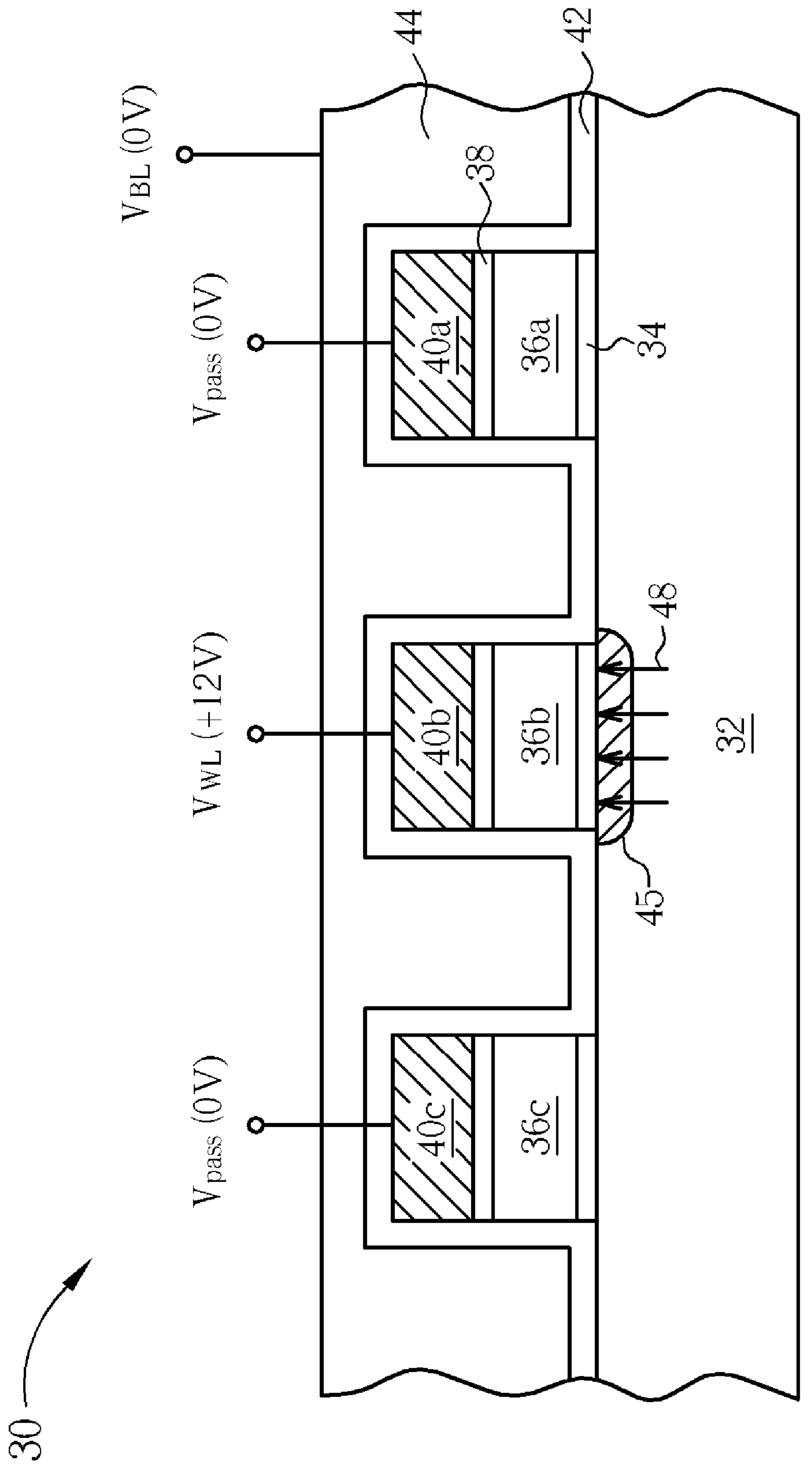

As shown by an arrow direction 48 shown in FIG. 6, while introducing electrons into the selected data storage element 36*b*, a positive voltage $V_{WL}$ is supplied to the selected control gate 40*b* above the data storage element 36*b*, and the selected bit line 44 together with the unselected control gates (such as the control gates 40*a*, 40*c*) crossing the bit line 44 are grounded. The positive voltage $V_{WL}$ is suggested to between +5V and +15V, and a preferred value of $V_{WL}$ can be +12V. The high voltage supplied to the selected control gate 40*b* induces an inversion layer 45 on the substrate 32 and attracts electrons to be introduced into the selected data storage element 36*b* following the direction 48.

Figure 7:
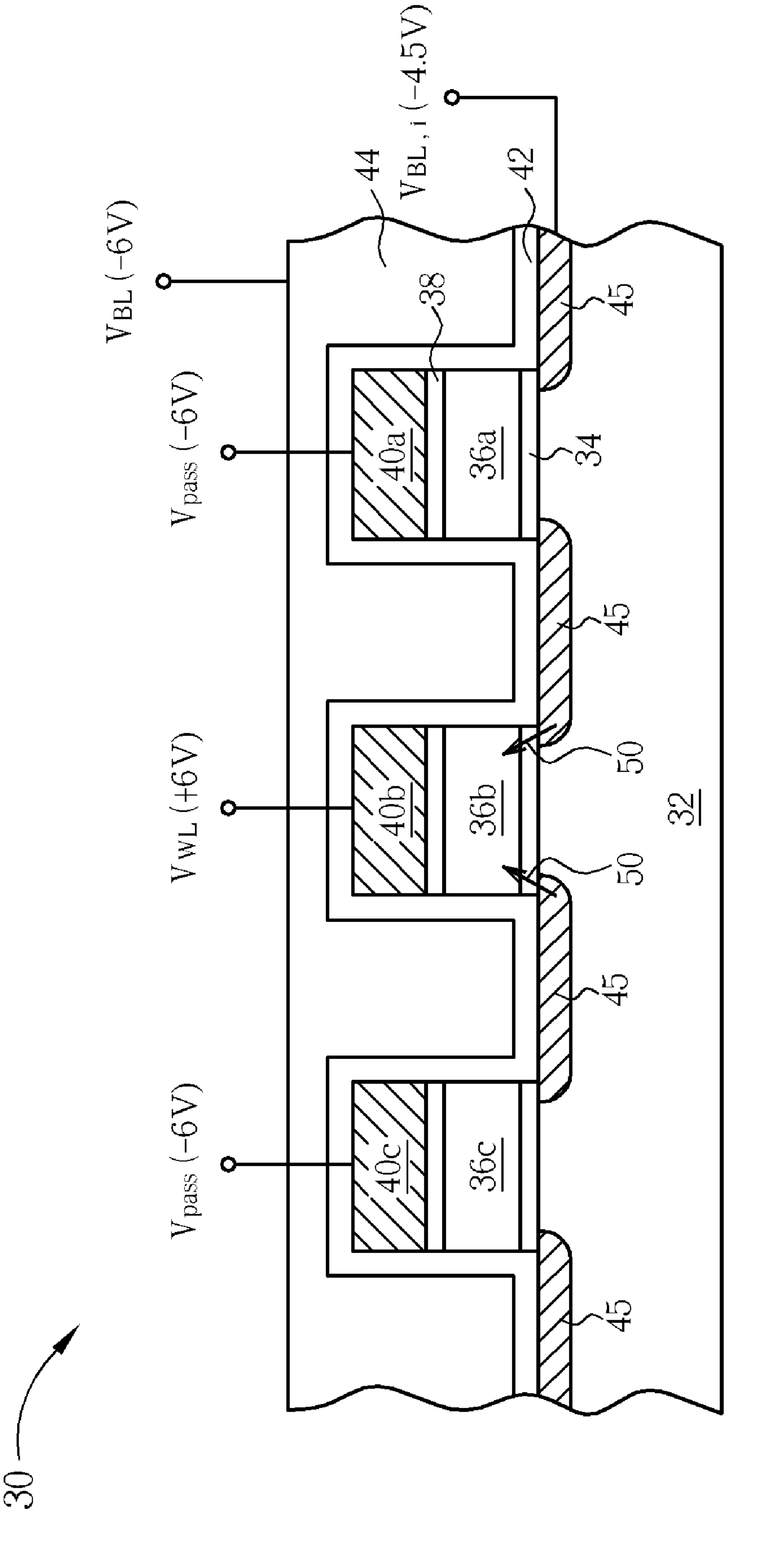
FIG. 7 and FIG. 8 illustrate a second embodiment of the present invention to program and erase a non-volatile memory.
Figure 8:
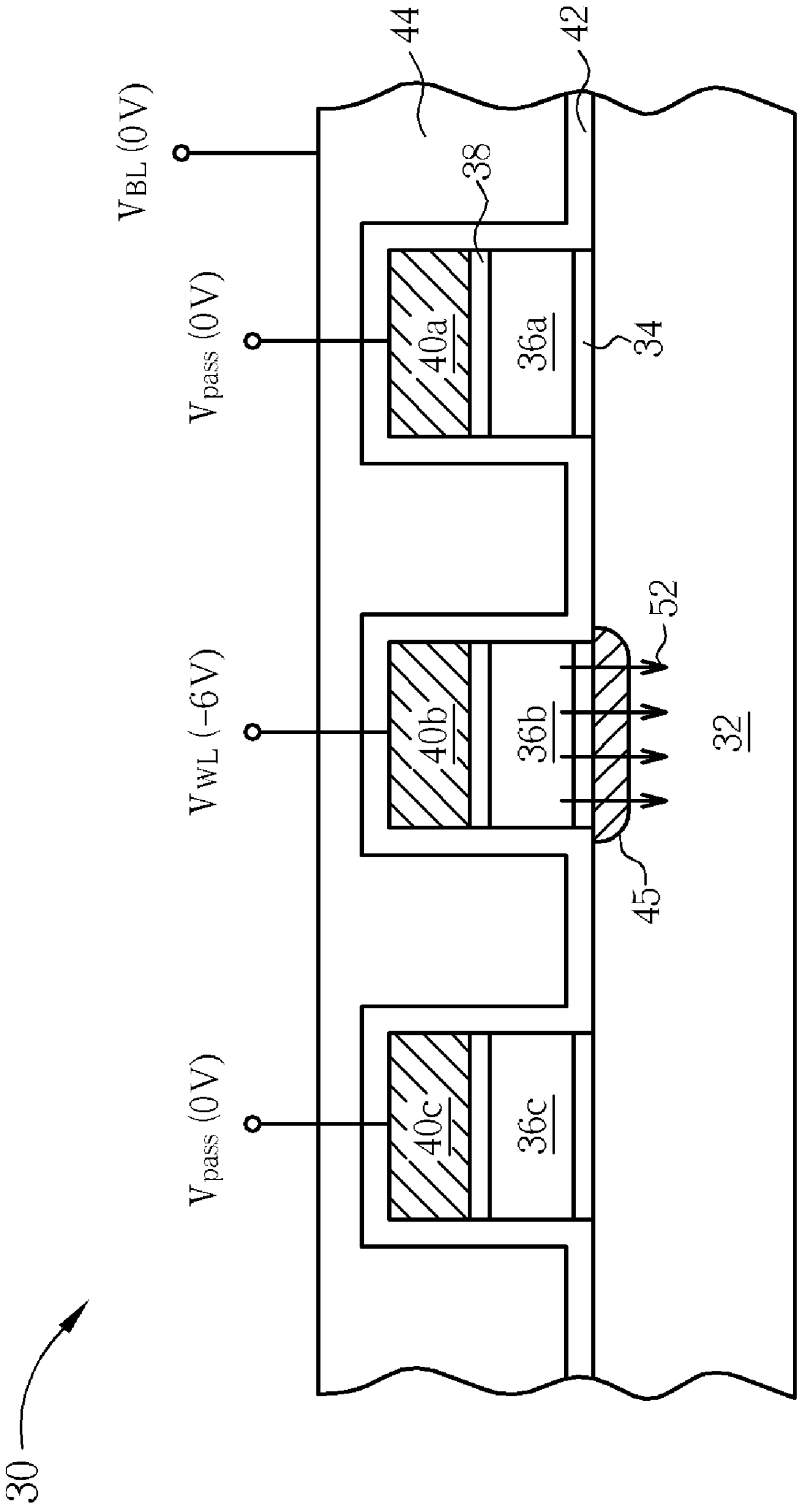

In a second embodiment shown in FIG. 7 and FIG. 8, a band-to-band tunneling induced hot-electron injection (BTBTHE) mechanism is used to introduce electrons into a selected memory cell so to achieve a programming operation of the non-volatile memory 30. In addition, a Fowler-Nordheim tunneling mechanism is used to remove electrons from a selected memory cell so as to achieve an erasing operation of the non-volatile memory 30. For example, to introduce electrons into the selected data storage element 36*b* following an arrow direction 50 shown in FIG. 7, a positive voltage $V_{WL}$ is supplied to the selected control gate 40*b* above the data storage element 36*b*, a negative voltage $V_{BL}$ is supplied to the selected bit line 44 above the data storage element 36*b*, and a negative voltage $V_{pass}$ is supplied to the unselected control gates (such as the control gates 40*a*, 40*c*) crossing the bit line 44. The positive voltage $V_{WL}$ is suggested to between +5V and +15V, and a preferred value of $V_{WL}$ can be +6V. The negative voltages $V_{BL}$ and $V_{pass}$ are suggested to between −5V and −10V, and a preferred value of $V_{BL}$ and $V_{pass}$ can be to −6V. When the negative voltage is supplied to the bit line 44, an inversion layer 45 is induced on the surface of the substrate 32 underneath the bit line 44, and the inversion layer 45 is used to transmit the bit line voltage to the source/drain of the selected memory cell. Preferably, a negative voltage $V_{BL,i}$, ranging between −4.5V and −5V, is supplied to the inversion layer 45, and thus a voltage difference of about 10.5V is provided between the gate and the drain of the selected memory cell. In this embodiment, the bit line 44 functions as a pass gate of the memory cell string along the bit line 44, and defines the voltage at the drain side of the selected memory cell. Because of the voltage difference between the selected control gate 40*b* and the drain side, electrons can be introduced into the selected data storage element 36*b* following the direction 50. To obtain better efficiency for operating a twin-bit memory cell, a buried doping region can be optionally formed in the substrate 32 to define a buried drain/source of each memory cell. A negative voltage can be supplied to the buried doping region to increase the voltage difference between the selected control gate 40*b* and the drain side. The voltage supplied to the buried doping region is suggested to between −1V and −5V, and a preferred value can be −4.5V.

As shown by an arrow direction 52 shown in FIG. 8, while removing electrons from the selected data storage element 36*b*, a negative voltage $V_{WL}$ is supplied to the selected control gate 40*b* above the data storage element 36*b*, and a positive voltage is supplied to the substrate 32. The negative voltage $V_{WL}$ is suggested to between −5V and −15V, and a preferred value of $V_{WL}$ can be −6V. The positive voltage supplied to the substrate 32 is suggested to between +5V and +10V, and a preferred value can be +6V. Because of the voltage difference between the selected control gate 40*b* and the substrate 32, an inversion layer 45 is induced on the substrate 32 and electrons can be removed from the selected data storage element 36*b* following the direction 52.

Figure 9:
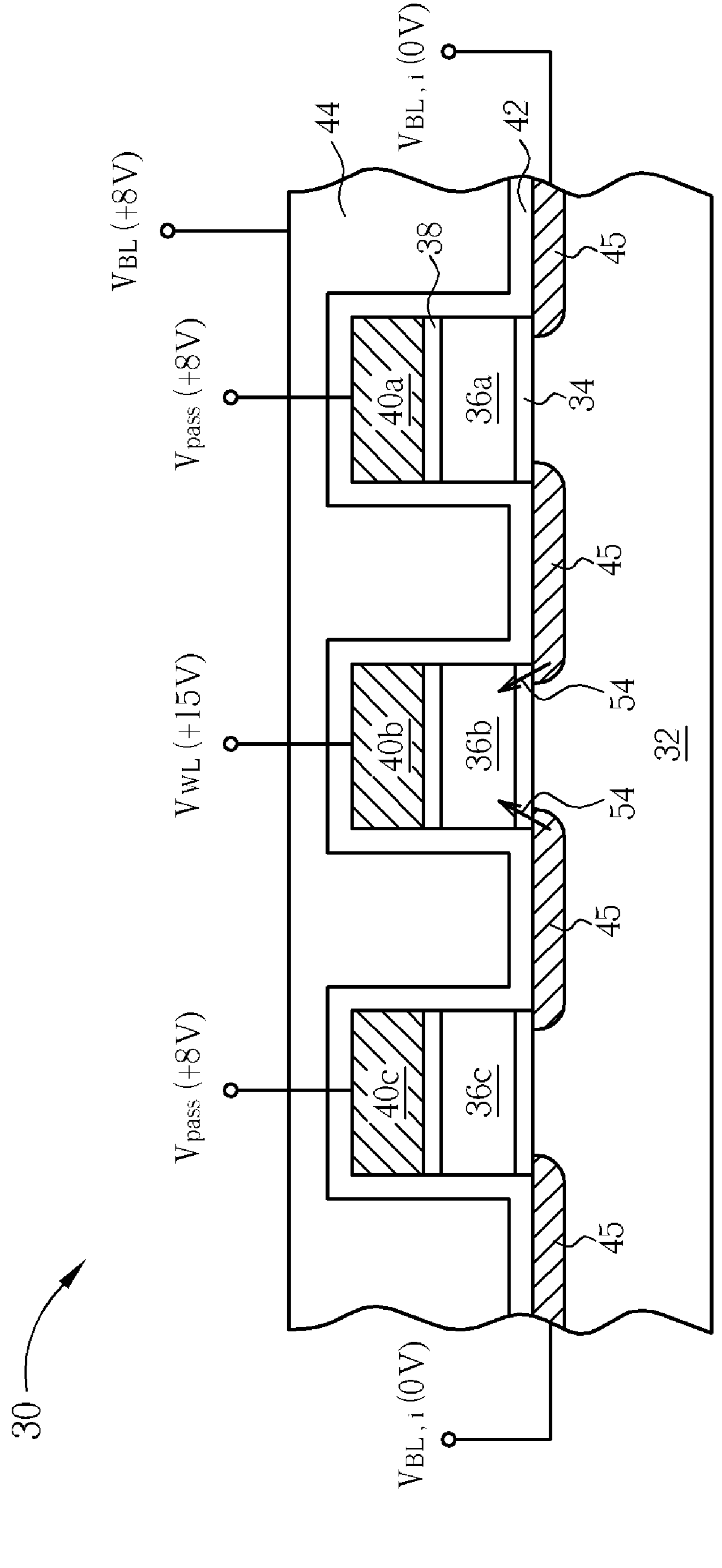
FIG. 9 and FIG. 10 illustrate a third embodiment of the present invention to program and erase a non-volatile memory.
Figure 10:
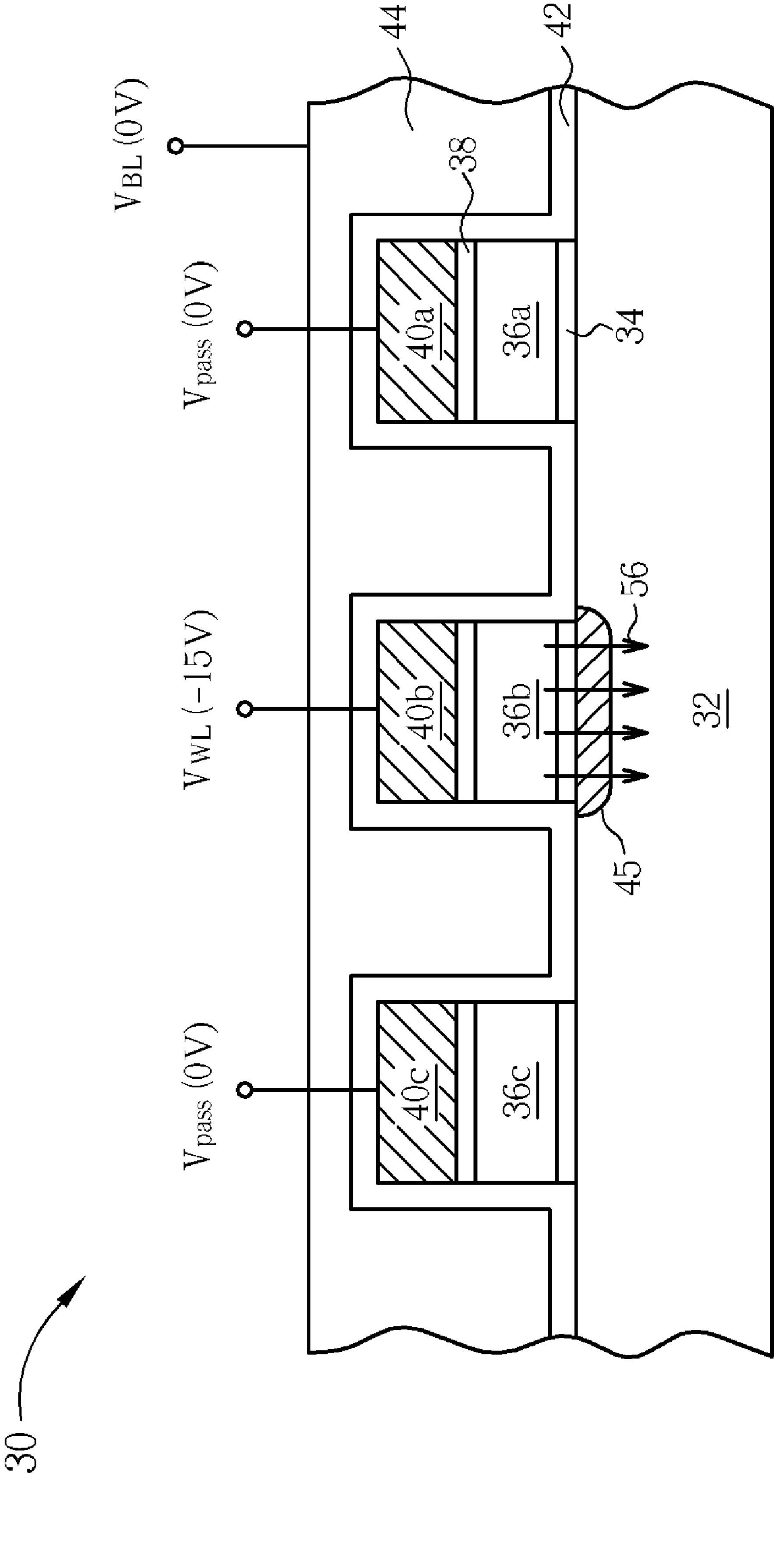

In a third embodiment shown in FIG. 9 and FIG. 10, a Fowler-Nordheim tunneling mechanism is used to introduce electrons into a selected memory cell so to achieve a programming operation of the non-volatile memory 30. In addition, a Fowler-Nordheim tunneling mechanism is used to remove electrons from a selected memory cell so as to achieve an erasing operation of the non-volatile memory 30. For example, to introduce electrons into the selected data storage element 36*b* following an arrow direction 54 shown in FIG. 9, a high voltage $V_{WL}$ is supplied to the selected control gate 40*b* above the data storage element 36*b*, a lower voltage $V_{BL}$ is supplied to the selected bit line 44 above the data storage element 36*b*, a lower voltage $V_{pass}$ is supplied to the unselected control gates (such as the control gates 40*a*, 40*c*) crossing the bit line 44, and the substrate 32 is grounded. The high voltage $V_{WL}$ is suggested to between +10V and +15V, and a preferred value of $V_{WL}$ can be +15V. The lower voltages $V_{BL}$ and $V_{pass}$ are suggested to between +5V and +8V, and a preferred value of $V_{BL}$ and $V_{pass}$ can be to +8V. When the positive voltage is supplied to the bit line 44, an inversion layer 45 is induced on the surface of the substrate 32 underneath the bit line 44, and the inversion layer 45 is used to transmit the bit line voltage to the source/drain of the selected memory cell. Preferably, a voltage supplied to the inversion layer 45 is 0V, and thus a voltage difference of about 15V is provided between the gate and the drain of the selected memory cell to support the Fowler-Nordheim tunneling operation. Because of the high voltage supplied to the selected control gate 40*b,* electrons can be introduced into the selected data storage element 36*b* following the direction 54.

As shown by an arrow direction 56 shown in FIG. 10, while removing electrons from the selected data storage element 36*b*, a negative voltage $V_{WL}$ is supplied to the selected control gate 40*b* above the data storage element 36*b*, and the substrate 32 is grounded. The negative voltage $V_{WL}$ is suggested to between −10V and −15V, and a preferred value of $V_{WL}$ can be −15V. Because of the negative voltage supplied to the selected control gate 40*b*, an inversion layer 45 is induced on the substrate 32 and electrons can be removed from the selected data storage element 36*b* following the direction 56.

The present invention provides an advantage of using the bit lines of the non-volatile memory as isolation structures to isolate the memory cells. For example, when operating a selected memory cell on the bit line 44, a 0V voltage is provided on the bit lines at both sides of the bit line 44 so as to use these bit lines with 0V to isolate the bit line 44 or the selected memory cell. Therefore, it is not essential for the present invention to form isolation structures such as field oxide layers or shallow trench isolation structures to isolation the neighboring bit lines. In a practical application, each bit line can be connected to an individual driving circuit, and a voltage supplied to each bit line is controlled by the individual driving circuit. Alternatively, the bit lines in odd columns can be connected to a driving circuit and the bit line in even columns can be connected to another driving circuit. A voltage switch is used to control the voltages supplied to the bit lines in the odd columns and the bit lines in the even columns, so as to provide a bit line voltage for a selected memory cell and simultaneously provide isolation structures surrounding the selected memory cell. In addition, the drain side and the source side of the selected memory cell can be reversed by reversing the operating voltages of the drain side and the source side, thus enabling the operation of a twin-bit memory cell.

Figure 11:
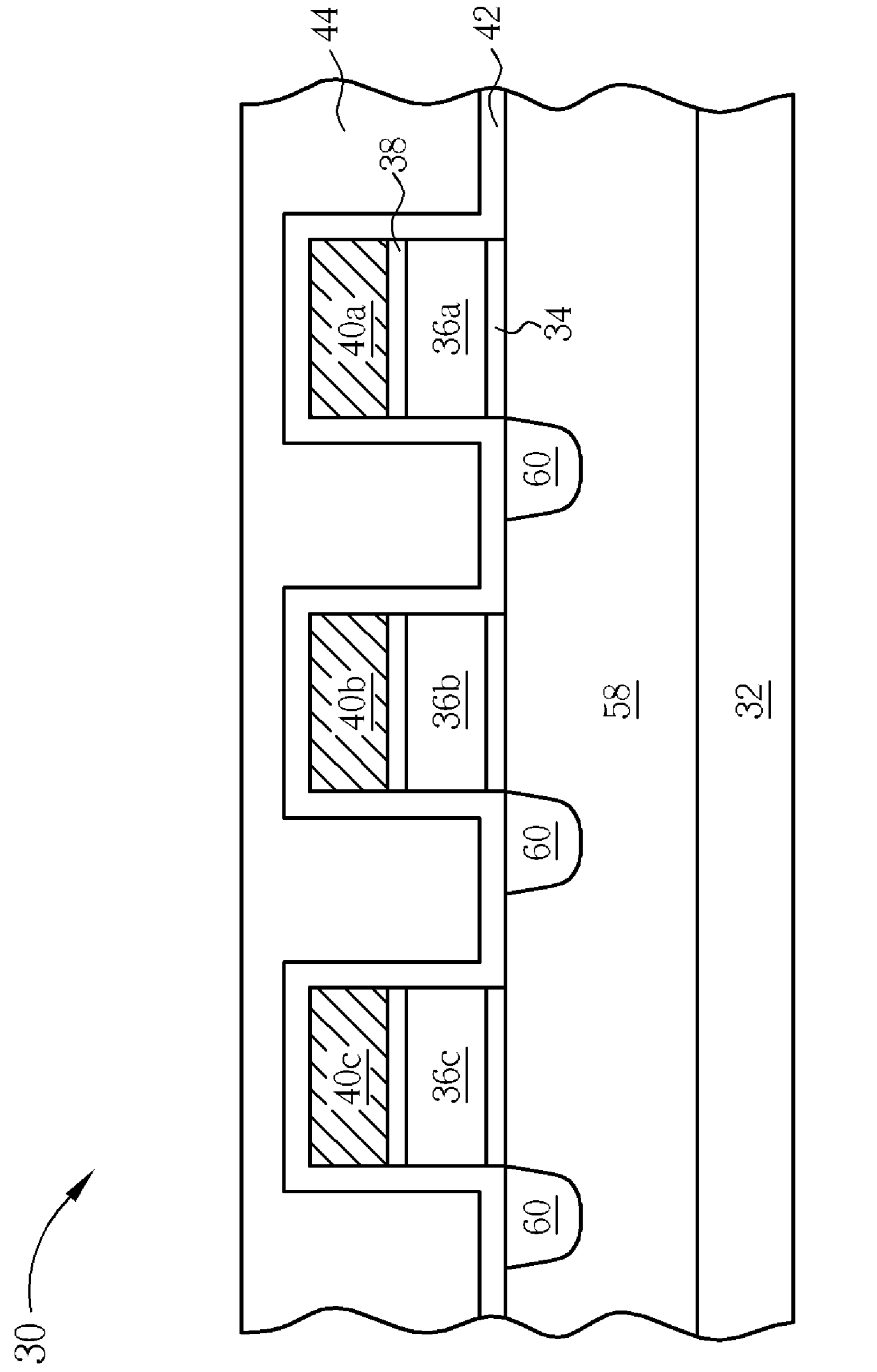
FIG. 11 is a cross-sectional diagram of a non-volatile memory according to the present invention.

Referring to FIG. 11, FIG. 11 is a cross-sectional diagram of a non-volatile memory according to another embodiment of the present invention. As shown in FIG. 11, the non-volatile memory 30 includes a doping well 58 positioned in the substrate 32, and a plurality of buried drains 60 positioned in the doping well 58. The non-volatile memory further includes the oxide layer 34, the data storage elements 36*a*, 36*b*, 36*c*, the oxide layer 38, the control gates 40*a*, 40*b*, 40*c*, and the insulating layer 42 positioned on the doping well 58, respectively. In addition, the non-volatile memory 30 further includes the bit line 44 positioned above the control gates 40*a*, 40*b*, 40*c* and crossing these control gates. The doping well 58 can be a P well or an N well. The buried drains 60 can be P-type doping regions or N-type doping regions. However, a conductive type of the doping well 58 is opposite to a conductive type of the buried drains 60. In this embodiment, the buried drain 60 is used as an assistant bit line. An appropriate voltage is supplied to the buried drain 60 to enhance the vertical electric field of the memory cell, such that the voltage supplied to the selected control gate can be effectively reduced.

Referring to FIG. 12, FIG. 12 is a parameter list for operating a non-volatile memory according to the present invention. As shown in FIG. 12, a programming operation of a selected memory cell (for example an N-channel memory cell) includes the steps of:

providing a positive voltage ($V_{BL,selected}$=+6V) on the bit line passing the selected memory cell, and grounding the other bit lines ($V_{BL,unselected}$=0V);

providing a negative voltage ($V_{WL}$=−6V) on the word line passing the selected memory cell, and providing a positive voltage ($V_{pass}$=+6V) on the other word lines;

providing a positive voltage ($V_{BL,i,selected}$=+4.5V) on the inversion layer underneath the selected bit line; and grounding the source side of the selected memory cell and the substrate ($V_{SL}$=0V, $V_{well}$=0V).

The parameters for erasing or reading the non-volatile memory can also be referred to FIG. 12. It is appreciated that all the operating voltages can be positive or negative depending upon the memory cell being an N-channel memory cell or a P-channel memory cell. In addition, the drain side and the source side of the selected memory cell can be reversed by reversing the operating voltages of the drain side and the source side, thus enabling the operation of a twin-bit memory cell.

In contrast to the flash memory of the prior art, the present invention provide a NAND-type non-volatile memory having bit lines positioned above word lines. A photolithographic and etching process can be used to define the patterns and the sizes of the word lines and the bit lines, so as to satisfy the minimum design rule and provide a 4F2 memory cell size. In addition, the present invention grounds the bit lines at both sides of a selected memory cell while programming the selected memory cell. Since these grounded bit lines can be used as isolation structures surrounding the selected memory cell, it is not essential for the present invention to form isolation structures such as field oxide layers or shallow trench isolation structures to isolate the neighboring bit lines. Furthermore, the non-volatile memory of the present invention can be applied in nitride-local-trap memories, so as to provide a 2F2 memory cell size and a memory cell array with higher density.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-volatile memory, comprising:

a substrate;

a plurality of data storage elements positioned on the substrate, each of the data storage elements being used to store at least one-bit data;

a plurality of control gates positioned above the data storage elements, the control gates being used to control operation of the data storage elements;

an insulating layer covering top surfaces and sidewalls of the control gates, and the substrate positioned between the control gates; and a bit-line positioned on the insulating layer to cross the control gates;

wherein conductive type dopants of portions of the substrate disposed right under the control gates are the same as conductive type dopants of portions of the substrate disposed between the control gates.

2. The non-volatile memory of claim 1, wherein each of the data storage elements comprises a floating gate.

3. The non-volatile memory of claim 1, wherein each of the data storage elements comprises a nitride layer.

4. The non-volatile memory of claim 3, wherein each of the data storage elements is used to store twin-bit data.

5. The non-volatile memory of claim 1, further comprising at least a buried doping region positioned within the substrate and adjacent to each of the data storage elements.

6. The non-volatile memory of claim 5, wherein the substrate further comprises at least a doping well, the buried doping region is positioned within the doping well, and a conductive type of the doping well is opposite to a conductive type of the buried doping region.

7. The non-volatile memory of claim 1, wherein the bit line and the control gates comprise doped polysilicon.

8. The non-volatile memory of claim 1, wherein the insulating layer is also positioned on sidewalls of the data storage elements.

9. A NAND-type non-volatile memory, comprising:

a substrate;

a plurality of word lines positioned on the substrate;

a plurality of bit lines positioned above and in between the word lines, and crossing the plurality of the word lines, each of the bit lines being in one-piece form and perpendicular to each of the word lines, a memory cell being defined at each of the intersection regions of the bit lines and the word lines; and an insulating layer covering top surfaces and sidewalls of the word lines, covering portions of the substrate disposed between the word lines, and separating the bit lines from the portions of the substrate disposed between the word lines.

10. The non-volatile memory of claim 9, wherein the memory cell comprises a data storage element.

11. The non-volatile memory of claim 10, wherein the data storage element comprises a floating gate.

12. The non-volatile memory of claim 10, wherein the data storage element comprises a nitride layer.

13. The non-volatile memory of claim 12, wherein the data storage element is used to store twin-bit data.

14. The non-volatile memory of claim 9, wherein the memory cell comprises at least a buried doping region positioned within the substrate.

15. The non-volatile memory of claim 14, wherein the substrate further comprises at least a doping well, the buried doping region is positioned within the doping well, and a conductive type of the doping well is opposite to a conductive type of the buried doping region.

16. The non-volatile memory of claim 9, wherein the plurality of word lines are used to define a plurality of control gates.

17. The non-volatile memory of claim 9, further comprising at least an insulating layer positioned on surfaces and sidewalls of the plurality of word lines.

18. The non-volatile memory of claim 9, wherein the plurality of bit lines comprise a source/drain of a selected memory cell.

19. The non-volatile memory of claim 9, wherein the plurality of bit lines comprise an isolation structure for isolating a selected memory cell.

20. The non-volatile memory of claim 9, wherein the plurality of bit lines and the plurality of word lines comprise doped polysilicon.

* * * * *